US012573448B2

(12) United States Patent
　　Vogelsang

(10) Patent No.: US 12,573,448 B2
(45) Date of Patent: **\*Mar. 10, 2026**

(54) DRAM DEVICE WITH MULTIPLE VOLTAGE DOMAINS

(71) Applicant: Rambus Inc., San Jose, CA (US)

(72) Inventor: Thomas Vogelsang, Mountain View, CA (US)

(73) Assignee: Rambus Inc., San Jose, CA (US)

( \* ) Notice: Subject to any disclaimer, the term of this patent is extended or adjusted under 35 U.S.C. 154(b) by 0 days.

This patent is subject to a terminal disclaimer.

(21) Appl. No.: 18/489,275

(22) Filed: Oct. 18, 2023

(65) Prior Publication Data

US 2024/0119995 A1　　Apr. 11, 2024

Related U.S. Application Data

(63) Continuation of application No. 17/295,753, filed as application No. PCT/US2019/063419 on Nov. 26, 2019, now Pat. No. 11,823,734.

(Continued)

(51) Int. Cl.
　　*G11C 5/14* 　　　　(2006.01)
　　*G11C 11/4074* 　　(2006.01)
　　　　　　(Continued)

(52) U.S. Cl.
　　CPC ...... *G11C 11/4091* (2013.01); *G11C 11/4074* (2013.01); *G11C 11/4094* (2013.01);
　　　　　　(Continued)

(58) Field of Classification Search
　　CPC ............ G11C 11/4091; G11C 11/4074; G11C 11/4094; G11C 11/4085; G11C 2207/002; G11C 2207/005
　　See application file for complete search history.

(56) References Cited

U.S. PATENT DOCUMENTS

| | | | |
|---|---|---|---|
| 5,257,232 A | 10/1993 | Dhong et al. | |
| 5,530,384 A | 6/1996 | Lee et al. | |

(Continued)

FOREIGN PATENT DOCUMENTS

| | | |
|---|---|---|
| CN | 102969019 A | 3/2013 |
| CN | 103858171 A | 6/2014 |

OTHER PUBLICATIONS

CN Office Action with Mail date Jan. 5, 2024 re: CN Appln. No. 201980053075.X. 9 pages.

(Continued)

*Primary Examiner* — Mushfique Siddique
(74) *Attorney, Agent, or Firm* — The Neudeck Law Firm, LLC

(57) ABSTRACT

A dynamic memory array of a DRAM device is operated using a bitline voltage that is greater than the operating (i.e., switching) voltage of a majority of the digital logic circuitry of the DRAM device. The digital logic circuitry is operated using a supply voltage that is lower than the voltage used to store/retrieve data on the bitlines of the DRAM array. This allows lower voltage swing (and thus lower power) digital logic to be used for a majority of the non-storage array logic on the DRAM device—thus reducing the power consumption of the non-storage array logic which, in turn, reduces the power consumption of the DRAM device as a whole.

20 Claims, 8 Drawing Sheets

Related U.S. Application Data

(60) Provisional application No. 62/773,761, filed on Nov. 30, 2018.

(51) Int. Cl.

| | |
|---|---|
| *G11C 11/4091* | (2006.01) |
| *G11C 11/4094* | (2006.01) |
| *G11C 11/408* | (2006.01) |

(52) U.S. Cl.
CPC .... *G11C 11/4085* (2013.01); *G11C 2207/002* (2013.01); *G11C 2207/005* (2013.01)

(56) References Cited

U.S. PATENT DOCUMENTS

| | | | |
|---|---|---|---|
| 5,710,738 A | | 1/1998 | Tai |
| 5,745,423 A | | 4/1998 | Tai |
| 5,848,015 A | | 12/1998 | Seno |
| 6,094,393 A | | 7/2000 | Tran |
| 6,343,038 B1 * | | 1/2002 | Makino .................... G11C 7/12 365/194 |
| 6,449,202 B1 | | 9/2002 | Akatsu et al. |
| 7,102,935 B2 * | | 9/2006 | Miki ........................ G11C 5/14 365/230.06 |
| 7,155,617 B2 | | 12/2006 | Gary et al. |
| 7,251,183 B2 | | 7/2007 | Itoh et al. |
| 7,313,041 B1 * | | 12/2007 | Chapman .......... G11C 11/40615 365/207 |
| 7,443,714 B1 | | 10/2008 | Kim |
| 7,463,096 B2 | | 12/2008 | Chi et al. |
| 7,583,555 B2 | | 9/2009 | Kang et al. |
| 8,780,664 B2 | | 7/2014 | Choi |
| 8,811,095 B2 | | 8/2014 | Tsem et al. |
| 9,256,376 B2 | | 2/2016 | Tsem et al. |
| 9,276,010 B2 | | 3/2016 | Chuang et al. |
| 9,584,122 B1 | | 2/2017 | McCombs |
| 2001/0028581 A1 * | | 10/2001 | Yanagisawa ........ G11C 11/4091 365/189.05 |
| 2002/0000624 A1 * | | 1/2002 | Takemura ........... G11C 11/4091 257/390 |
| 2005/0226081 A1 | | 10/2005 | Kajitani et al. |
| 2006/0256625 A1 | | 11/2006 | Kajitani et al. |
| 2007/0070754 A1 | | 3/2007 | Vogelsang |
| 2009/0080234 A1 * | | 3/2009 | Takahashi ........... G11C 11/4091 365/189.11 |
| 2012/0194222 A1 * | | 8/2012 | Hoefler .................... G11C 7/04 327/512 |
| 2015/0098267 A1 | | 4/2015 | Jain et al. |
| 2017/0040052 A1 * | | 2/2017 | Jain .......................... G11C 7/12 |
| 2021/0159109 A1 | | 5/2021 | Or-Bach et al. |

OTHER PUBLICATIONS

EP Extended European Search Report with Mail Date Aug. 5, 2022 re: EP Appln. No. 19889108.7. 9 pages.

EP Response filed Feb. 22, 2023 (with incorrect date of Jan. 22, 2023) in Response to the Extended European Search Report dated Aug. 5, 2022 and the Communication Pursuant to Rules 70(2) and 70a(2) EPC dated Aug. 23, 2022 re: EP Appln. No. 19889108.7. 24 pages.

Notification of Transmittal of the International Search Report and the Written Opinion of the International Searching Authority, or the Declaration with Mail Date Apr. 2, 2020 re: Int'l Appln. No. PCT/US2019/063419. 12 Pages.

\* cited by examiner

700

PROCESSOR(S)
702

COMMUNICATION
DEVICE(S)
706

708

MEMORY 704

PROCESS(ES)
712

USER INPUTS
714

CIRCUIT
COMPONENT
720

PARAMETERS
716

PSET>VBL-VT222
(E.G., PSET=VBL)

VBL>VDD

222

SAP

SAN

NSET<VT221
(E.G., NSET=VNEG)

221

VNEG

220

PSET<VBL-VT222
(E.G., PSET=VNEG)

VBL>VDD

222

SAP

SAN

VBL>NSET>VT221
(E.G., NSET=VDD)

221

VNEG

220

DRAM DEVICE WITH MULTIPLE VOLTAGE DOMAINS

DETAILED DESCRIPTION OF THE EMBODIMENTS

Reducing power consumption of electronics and computer systems is an ongoing goal. Accordingly, reducing the power consumption of dynamic random access memory (DRAM) devices is part of that effort. The main contributors to the power consumption of DRAM devices are associated with the formula $P = CV^2 f$, where P is power consumption, C is capacitance, V is the switching voltage, and f is the switching frequency. Thus, because the voltage is squared in the preceding formula, reducing the switching voltage can have an important effect on reducing the power consumption.

In an embodiment, the dynamic memory array(s) of a DRAM device are operated using a bitline voltage that is greater than the operating (i.e., switching) voltage of a majority of the digital logic circuitry of the DRAM device. In other words, the digital logic circuitry is operated using a supply voltage that is lower than the voltage used to store/retrieve data from the DRAM array. This allows lower voltage swing (and thus lower power) digital logic to be used for a majority of the non-storage array logic on the DRAM device—thus reducing the power consumption of the non-storage array logic which, in turn, reduces the power consumption of the DRAM device as a whole.

Figure 1:
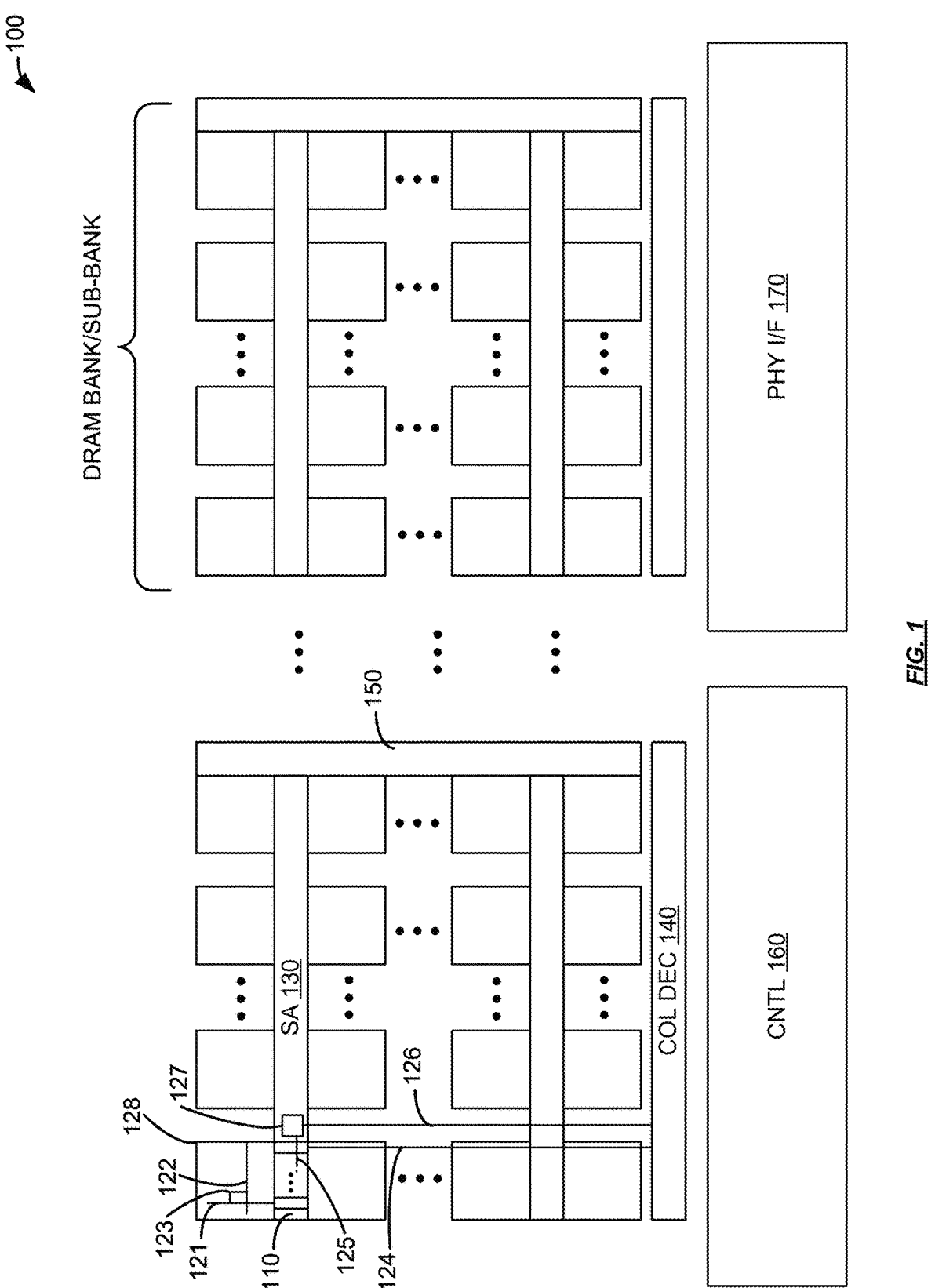
FIG. 1 is a block diagram illustrating a dynamic random access memory (DRAM) device according to an embodiment.

FIG. 1 is a block diagram illustrating a dynamic random access memory (DRAM) device according to an embodiment. In FIG. 1, DRAM device 100 includes multiple banks/sub-banks, control circuitry 160 and interface circuitry 170. DRAM device 100 may be, be on, or comprise at least one integrated circuit. The DRAM banks include subarrays (e.g., subarray 128), sense amplifier stripes (e.g., sense amplifier stripe 130), column decode and subarray access circuitry 140, and wordline control circuitry 150. The sense amplifier stripes 130 include sense amplifiers (e.g., sense amplifier 110) and local-global switches (e.g., local-global switch 127). The subarrays include memory bit cells (e.g., cell 123). The memory bit cells 123 connect to wordlines 122, bitlines 121, and column select lines 124. The sense amplifiers 110 connect to bitlines 121 and local data lines 125. Local-global switches 127 connect to local data lines 125 and global data lines 126.

Control circuitry 160 is operatively coupled to the DRAM banks to process at least column addresses, row addresses, and/or commands received via physical interface 170. Control circuitry 160 is comprised of digital logic circuitry that operates, in a normal operating mode, using a selected (e.g., by the manufacturer of DRAM device 100) digital logic supply voltage (a.k.a., VDD.) Control circuitry 160 may comprise a majority of circuitry implemented using complementary metal-oxide-semiconductor (CMOS) type logic gates. Control circuitry 160 may comprise a circuitry implemented using CMOS logic implemented in a high-K/metal gate (HKMG) CMOS fabrication process. The signal swings (i.e., between a logical '1' and a logical '0') of full-swing CMOS logic gates may range from a minimum corresponding to the negative supply/reference/substrate voltage up to a maximum voltage corresponding to the digital logic supply voltage.

In an embodiment, DRAM device 100 operates, in a normal operating mode (i.e., a non-test mode), using a bitline voltage (i.e., maximum voltage with respect to the negative supply/reference/substrate voltage) that is higher than the digital logic supply and/or maximum signal swing level (with respect to the same negative supply/reference/substrate voltage as the bitline voltage is referenced to) of a majority of the digital logic on DRAM device 100. In particular, bitlines 121 may be operated using a maximum voltage that is greater than control circuitry 160. For brevity, the bitline voltage may be referred to herein as VBL.

A normal operating (non-test) mode includes the expected operating modes for DRAM device 100 in a system that is being used in a non-production and non-test environment. For example, DRAM device 100 may be tested or otherwise operated in one or more test mode before being included in a larger system (e.g., completed computer system, consumer electronic device, etc.) These test modes may be used during various manufacturing processes and/or stages, but are typically not used while the system is being used by an end user (e.g., consumer, data center, etc.)

Test modes may be used, for example, at times, such as during burn-in, to 'stress' DRAM device 100 in order to confirm the functioning and/or reliability of DRAM device 100. Likewise, the digital logic supply voltage may be lowered below the bitline voltage during testing to confirm the functioning and/or reliability of DRAM device 100. However, test modes are not typically used during 'normal' operation because the functioning, performance, lifetime, and/or reliability of DRAM device 100 may be degraded while being operating in one or more test modes (as opposed to 'normal' operating modes.)

Sense amplifier stripes 130 and the sense amplifiers therein (e.g., sense amplifier 110) may be operated, in a normal operating mode, using a selected (e.g., by the manufacturer) bitline voltage (and/or bitline voltage range). Wordline control circuitry 150 may be operated, in a normal operating mode, using the digital logic supply voltage and/or a separate programming power supply voltage (VPP) that may be present to support high core word line voltage requirements. Column decode circuitry 140 may be operated, in a normal operating mode, using the bitline voltage or the digital logic supply voltage. Control circuitry (and included datapath circuitry) 160 may be operated, in a normal operating mode, using the digital logic supply voltage. Interface circuitry 170 may be operated, in a normal operating mode, using an input/output (I/O) supply voltage and/or the digital logic supply voltage.

Figure 2:
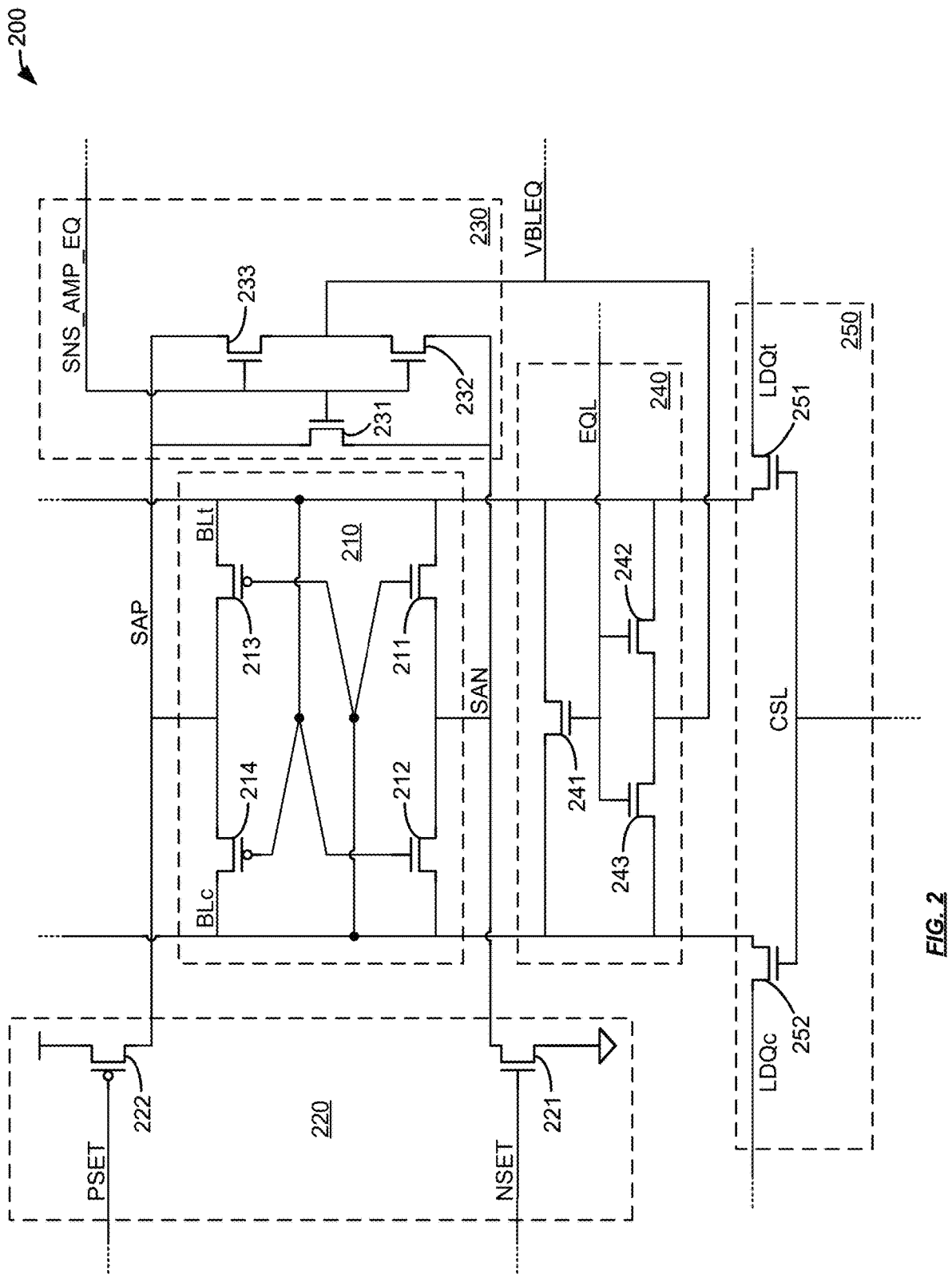
FIG. 2 is a diagram illustrating an example sense amplifier.

FIG. 2 is a diagram illustrating an example sense amplifier. Sense amplifier 200 may be part of DRAM 100 and/or amplifier stripes 130 (i.e., as sense amplifier 110, in particular.) In FIG. 2, sense amplifier 200 includes functional blocks 210, 220, 230, 240, and 250. Sense amplifier 200 performs the evaluation of the voltage difference on the true (BLt) and complement (BLc) bitlines.

Amplifier block 210 is comprised of a pair of cross-coupled inverters that are switched on by evaluate control block 220. The cross-coupled inverters of amplifier block 210 comprise n-channel field effect transistors (NFETs) 211 and 212, and p-channel field effect transistors (PFETs) 213 and 214. NFET 211 and PFET 214 form a first inverter that is cross-coupled to a second inverter formed using NFET 212 and PFET 214. The outputs of each inverter is provided to the input of the other inverter (i.e., cross-coupled). The negative supply and the positive supply to the inverters of amplifier block 210 are selectively provided by evaluate control block 220.

The power supplies SAN and SAP to these inverters are selectively (switchably) provided to amplifier block 210 by evaluate control block 220 in order to allow the internal and external nodes of/to amplifier block 210 (including the bitlines BLt and BLc, and power supplies SAN and SAP) to be equalized and then activated to evaluate the voltages on the bitlines BLt and BLc. Evaluate control block 220 includes NFET 221 and PFET 222. NFET 221, under the control of the signal on the NSET node, switchable connects and disconnects the negative (reference) supply voltage to the node SAN (which is the negative supply for amplifier block 210). PFET 222, under the control of the signal on the PSET node, switchable connects and disconnects the positive supply voltage to the node SAP (which is the positive supply for amplifier block 210). NFET 221, under the control of the signal on the NSET node, switchable connects and disconnects the negative (reference) supply voltage to the node SAN (which is the negative/reference supply for amplifier block 210. The signal provided to the NSET node (i.e., gate of NFET 221) may have a swing that is less than the bitline voltage. Thus, in normal operation, the control circuitry (e.g., control circuitry 160) coupled to evaluate control block 220 may comprise circuitry that can supply the NSET node with a signal that does not reach VBL (or even reaches VBL minus PFET 222's threshold voltage.)

In an embodiment, in normal operation, the positive supply voltage connected to SAP by PFET 222 may be the bitline voltage (or, in an embodiment, a higher voltage). The swing of the signal on PSET (i.e., the gate of PFET 222) may be equal to (or less than a threshold voltage of PFET 222 lower than) the positive supply voltage (e.g., VBL) to be connected to SAP. Thus, in normal operation, the control circuitry coupled to evaluate control block 220 may comprise circuitry that can supply the PSET node with a signal that reaches VBL (or alternatively, reaches VBL minus PFET 222's threshold voltage.)

Figure 8A:
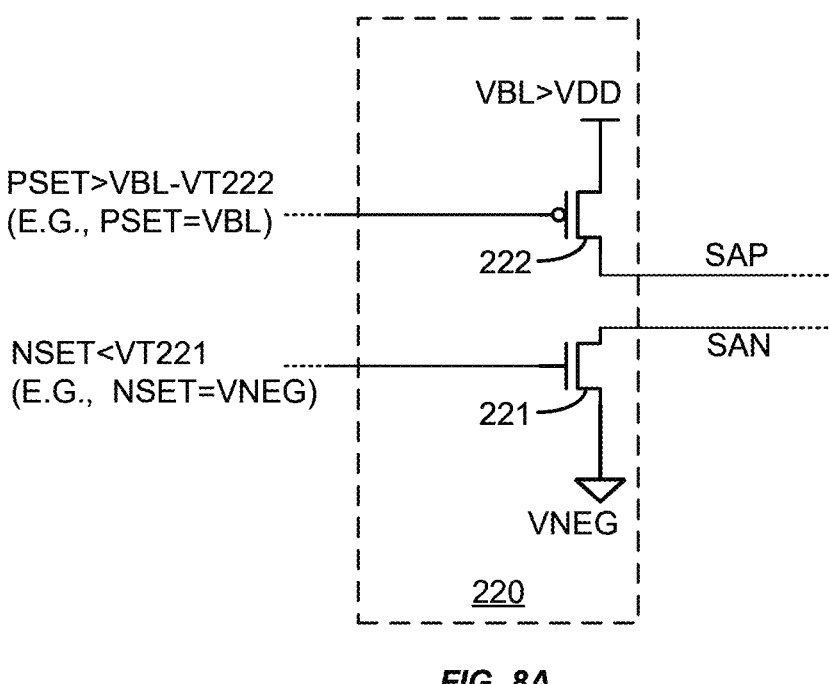
FIG. 8A is a diagram illustrating an evaluate control block biased to disconnect an amplifier block.
Figure 8B:
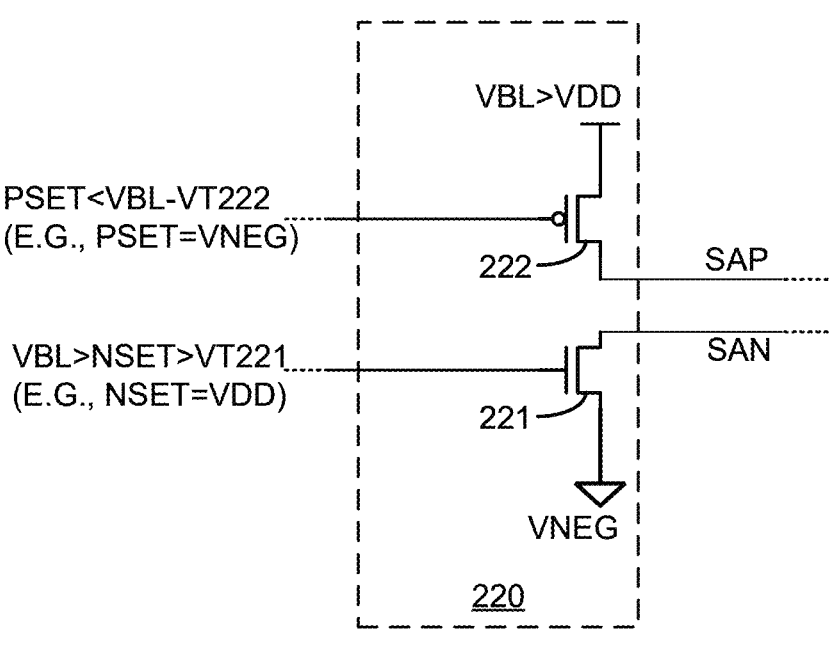
FIG. 8B is a diagram illustrating an evaluate control block biased to connect an amplifier block.

The foregoing is further illustrated in FIGS. 8A-8B. In FIG. 8A, example PSET and NSET voltages that respectively disconnect SAP and SAN respectively from VBL and the negative/reference supply voltage (VNEG in FIGS. 8A-8B) are illustrated (thereby deactivating amplifier block 210). In FIG. 8B, example PSET and NSET voltages that respectively connect SAP and SAN respectively to VBL and VNEG are illustrated (thereby activating amplifier block 210). In FIGS. 8A-8B, VT221 is the threshold voltage of FET 221 and VT222 is the threshold voltage of FET 222.

Sense amplifier equalize block 230, when activated via a signal on node SNS_AMP_EQ connects SAP and SAN together and to an equalize supply voltage VBLEQ. Sense amplifier equalize block 230 includes NFETs 231-233. The gates of NFETs 231-233 are operatively coupled together and to node SNS_AMP_EQ. The source and drain nodes of NFET 231 are connected to SAN and SAP, respectively. The source and drain nodes of NFET 232 are connected to SAN and VBLEQ, respectively. The source and drain nodes of NFET 233 are connected to VBLEQ and SAP, respectively. The signal provided to SNS_AMP_EQ may have a swing that is less than the bitline voltage. Thus, in normal operation, the control circuitry (e.g., control circuitry 160) coupled to sense amplifier equalize block 230 may comprise circuitry that can supply the SNS_AMP_EQ node with a signal that does not reach VBL (or even does not reach VBL minus PFET 222's threshold voltage.)

Bitline equalize block 240, when activated via a signal on node EQL, connects the bitlines BLt and BLc together and to an equalize supply voltage VBLEQ. Bitline equalize block 240 includes NFETs 241-243. The gates of NFETs 241-243 are operatively coupled together and to node EQL. The source and drain nodes of NFET 241 are connected to BLt and BLc, respectively. The source and drain nodes of NFET 242 are connected to BLt and VBLEQ, respectively. The source and drain nodes of NFET 243 are connected to VBLEQ and BLc, respectively. The signal provided to EQL may have a swing that is less than the bitline voltage. Thus, in normal operation, the control circuitry (e.g., control circuitry 160) coupled to bitline equalize block 240 may comprise circuitry that can supply the EQL node with a signal that does not reach VBL (or even does not reach VBL minus PFET 222's threshold voltage.)

Column connect block 250 selectively (switchably) connects (a.k.a., gates) the bitlines BLt and BLc to local data lines LDQt and LDQc, respectively. Column connect block 250 includes NFETs 251-252. The gates of NFETs 251-252 are operatively coupled together and to node CSL. The source and drain nodes of NFET 251 are connected to BLt and LDQt, respectively. The source and drain nodes of NFET 252 are connected to BLc and LDQt, respectively. The swing of the signal on CSL (i.e., the gates of NFETs 251-252) may be greater than or equal to the bitline voltage. The swing of the signal on CSL (i.e., the gates of NFETs 251-252) may be greater than or equal to the bitline voltage plus the threshold voltage of the NFETs 251-252. Thus, in normal operation, the control circuitry coupled to column connect block 250 may comprise circuitry that can supply the CSL node with a signal that at least reaches VBL.

Figure 3:
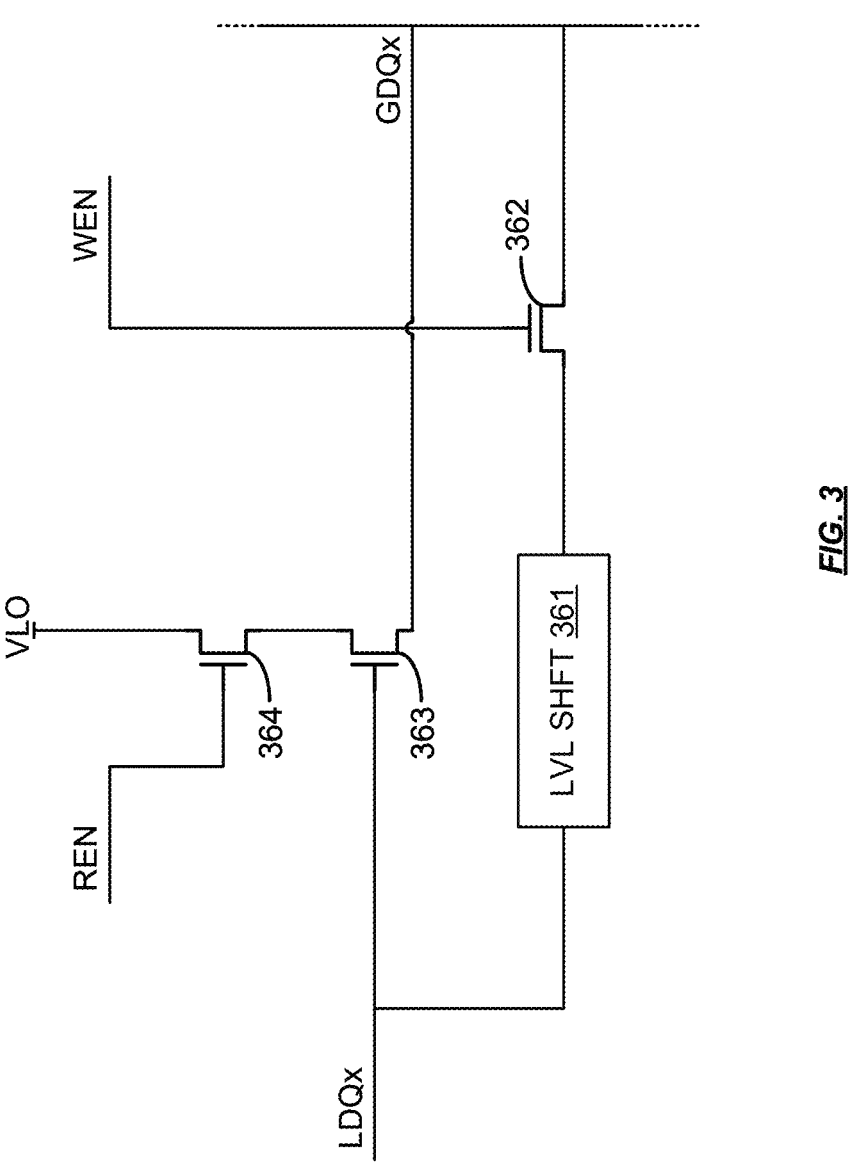
FIG. 3 is a diagram illustrating an example local-global data line switch.

FIG. 3 is a diagram illustrating an example local-global data line switch. Local-global switch 300 may be part of DRAM 100 and/or amplifier stripes 130 (i.e., as local-global switch 127, in particular.) In FIG. 3, local-global switch 300 includes level shifter 361 and NFETs 362-364. Under the control of signals on nodes REN and WEN, local-global switch 300 selectively couples or gates a given local data line (e.g., LDQt or LDQc—illustrated as LDQx in FIG. 3) to a given global data line (e.g., GDQt or GDQc—illustrated as GDQx in FIG. 3).

In FIG. 3, a first node of level shifter 361 is connected to the local data line LDQx. A second node of LDQx is connected to the source of NFET 362. The gate of NFET 362 is connected to node WEN (a.k.a., write enable.) The drain of NFET 362 is connected to the global data line GDQx. LDQx is also connected to the gate of NFET 363. The source of NFET 363 is connected to the global data line GDQx. The drain of NFET 363 is connected to the source of NFET 364. The gate of NFET 364 is connected to the node REN (a.k.a., read enable). The drain of NET 364 is connected to a local-global switch voltage VLO. VLO is typically less than the bitline voltage.

The signals provided to REN and WEN may have a swing that is less than the bitline voltage. Thus, in normal operation, the control circuitry (e.g., control circuitry 160) coupled to local-global switch 300 may comprise circuitry that can supply the REN and WEN nodes with signals that do not reach VBL (or even do not reach VBL minus NFET 362-364's threshold voltage.)

Figure 4:
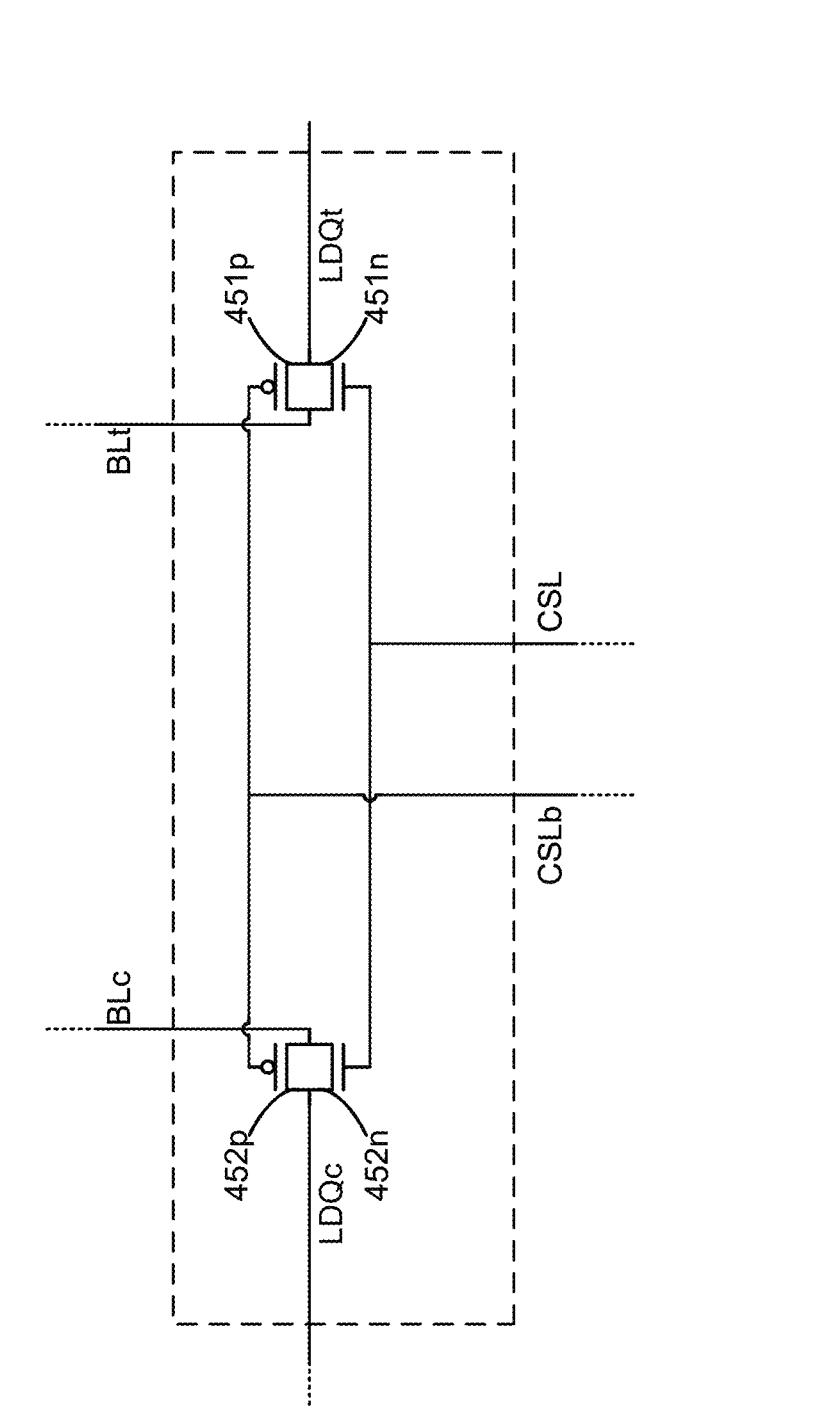
FIG. 4 is a diagram illustrating an example bitline to local data line switch.

FIG. 4 is a diagram illustrating an example bitline to local data line switch. Bitline to local data line switch 400 may be part of DRAM 100 and/or amplifier stripes 130 (i.e., as part of sense amplifier 110, in particular.) In an embodiment, bitline to local data line switch 400 may be used as a column connect block 250. In FIG. 4, bitline to local data line switch 400 includes NFETs 451n-452n and PFETs 451p-452p. NFET 451n and PFET 451p are configured as a first transmission gate (a.k.a. pass-gate.) NFET 452n and PFET 452p are configured as a second transmission gate (a.k.a. pass-gate.) The gates of NFETs 451n-452n are connected to node CSL. The swing of the signal on CSL (i.e., the gates of NFETs 451n-452n) may be less than the bitline voltage. Thus, in normal operation, the control circuitry coupled to bitline to local data line switch 400 may comprise circuitry that does not supply the CSL node with a signal that reaches VBL (e.g., the digital logic supply voltage.)

The signal on CSLb is the complement (i.e., logical inversion) of the signal on CSLn. The gates of PFETs 451p-452p are connected to node CSLb. The swing of the signal on CSLb (i.e., the gates of PFETs 451p-452p) may be equal to the bitline voltage. The swing of the signal on CSLb (i.e., the gates of PFETs 451p-452p) may be greater than to the bitline voltage minus the threshold voltage of the PFETs 451p-452p. Thus, in normal operation, the control circuitry coupled to evaluate control block 420 may comprise circuitry that can supply the CSLb node with a signal that at least reaches VBL minus the threshold voltage of the PFETs 451p-452p.

Figure 5:
FIG. 5 is a diagram illustrating elements of an offset compensated sense amplifier.

FIG. 5 is a diagram illustrating elements of an offset compensated sense amplifier. Sense amplifier 500 may be part of DRAM 100 and/or amplifier stripes 130 (i.e., as sense amplifier 110, in particular.) In FIG. 5, sense amplifier 500 includes functional blocks 510, 520, and 540. Other functional block of sense amplifier 500 have been omitted from FIG. 5 for the sake of brevity. Sense amplifier 500 performs the evaluation of the voltage difference on the true (BLt) and complement (BLc) bitlines.

Amplifier block 510 is comprised of a pair of cross-coupled inverters that are switched on by evaluate control block 520. The cross-coupled inverters of amplifier block 510 comprise n-channel field effect transistors (NFETs) 511 and 512, and p-channel field effect transistors (PFETs) 513 and 514. NFET 511 and PFET 514 form a first inverter that is cross-coupled to a second inverter formed using NFET 512 and PFET 514. The outputs of each inverter is provided to the input of the other inverter (i.e., cross-coupled). The negative supply and the positive supply to the inverters of amplifier block 510 are selectively provided by evaluate control block 520.

The power supplies SAN and SAP to these inverters are selectively (switchably) provided to amplifier block 510 by evaluate control block 520 in order to allow the internal and external nodes of/to amplifier block 510 (including the bitlines BLt, BLc, internal nodes SABLt, SABLc, and power supplies SAN and SAP) to be equalized and then activated to evaluate the voltages on the bitlines BLt and BLc. Evaluate control block 520 includes NFET 521 and PFET 522. NFET 521, under the control of the signal on the NSET node, switchable connects and disconnects the negative (reference) supply voltage to the node SAN (which is the negative supply for amplifier block 210). PFET 522, under the control of the signal on the PSET node, switchable connects and disconnects the positive supply voltage to the node SAP (which is the positive supply for amplifier block 510). NFET 521, under the control of the signal on the NSET node, switchable connects and disconnects the negative (reference) supply voltage to the node SAN (which is the negative/reference supply for amplifier block 510. The signal provided to the NSET node (i.e., gate of NFET 521) may have a swing that is less than the bitline voltage. Thus, in normal operation, the control circuitry (e.g., control circuitry 160) coupled to evaluate control block 520 may comprise circuitry that can supply the NSET node with a signal that does not reach VBL (or even reaches VBL minus PFET 522's threshold voltage.)

In an embodiment, in normal operation, the positive supply voltage connected to SAP by PFET 522 may be the bitline voltage (or, in an embodiment, a higher voltage). The swing of the signal on PSET (i.e., the gate of PFET 522) may be equal to (or less than a threshold voltage of PFET 522 lower than) the positive supply voltage (e.g., VBL) to be connected to SAP. Thus, in normal operation, the control circuitry coupled to evaluate control block 520 may comprise circuitry that can supply the PSET node with a signal that reaches VBL (or alternatively, reaches VBL minus PFET 522's threshold voltage.)

Offset compensation switch block 540, when activated via signals on nodes ISO and OC, disconnects the bitlines BLt and BLc from internal amplifier block 510 nodes SABLt and SABLc, respectively; connects BLt to SABLc; and, connects BLc to SABLt. Offset compensation switch block 540 includes NFETs 541-544. The gates of NFETs 541-542 are operatively coupled together and to node ISO (a.k.a., isolate.) The source and drain nodes of NFET 541 are connected to BLt and SABLt, respectively. The source and drain nodes of NFET 542 are connected to BLc and SABLc, respectively. The source and drain nodes of NFET 543 are connected to BLt and SABLc, respectively. The source and drain nodes of NFET 544 are connected to BLc and SABLt, respectively. The swing of the signals on ISO and OC (i.e., the gates of NFETs 541-544) may be greater than or equal to the bitline voltage. The swing of the signal on ISO and OC (i.e., the gates of NFETs 541-544) may be greater than or equal to the bitline voltage plus the threshold voltage of the NFETs 541-544. Thus, in normal operation, the control circuitry coupled to offset compensation switch block 540 may comprise circuitry that can supply the ISO and OC nodes with signals that at least reach VBL.

Figure 6:
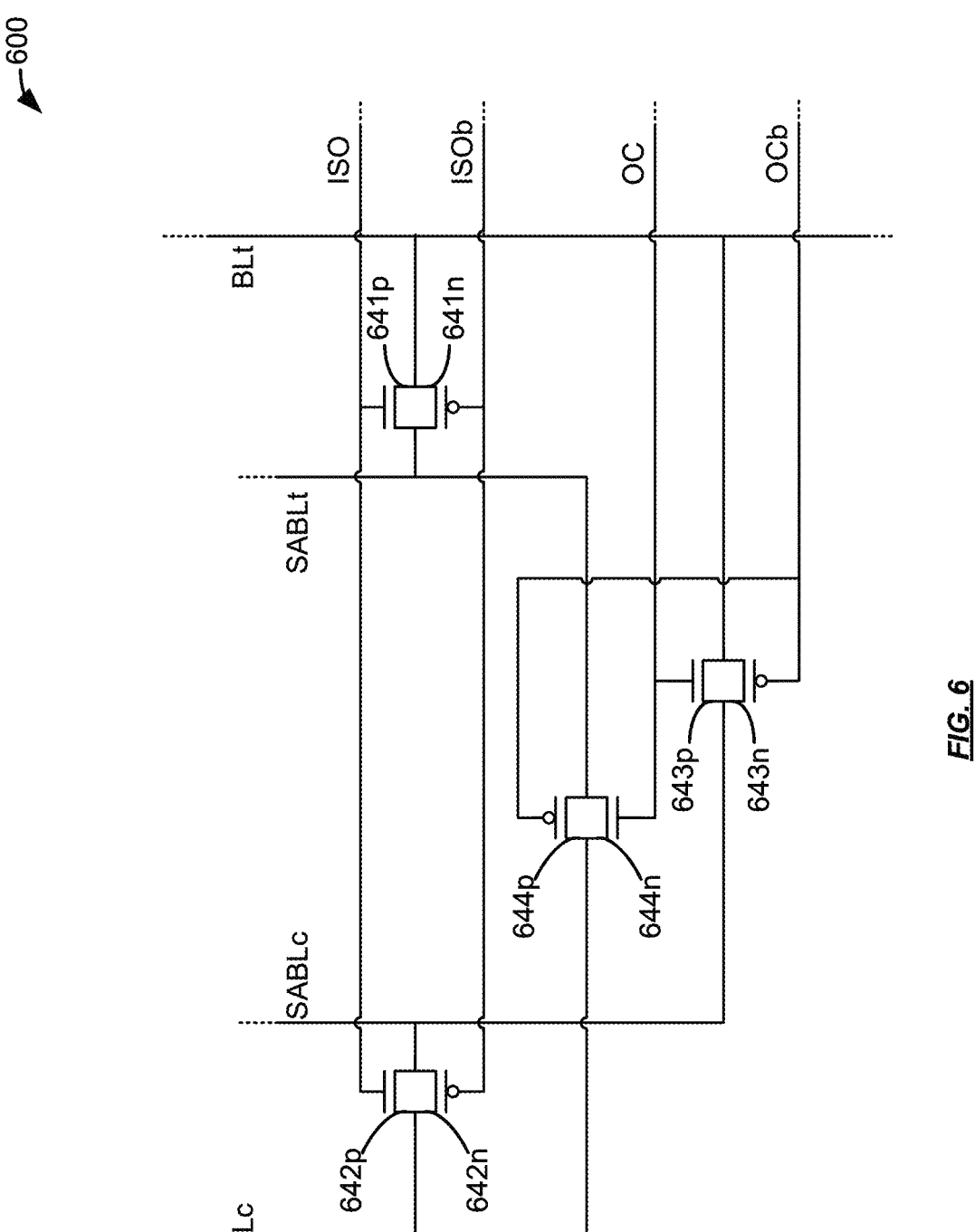
FIG. 6 is a diagram illustrating an example bitline equalize block for an offset compensated sense amplifier.

FIG. 6 is a diagram illustrating an example offset compensation switch block for an offset compensated sense amplifier. Offset compensation switch block 600 may be part of DRAM 100 and/or amplifier stripes 130 (i.e., as part of sense amplifier 110, in particular.) In an embodiment, offset compensation switch block 600 may be used as offset compensation switch block 540.

In FIG. 6, offset compensation switch block 600 includes NFETs 641n-644n and PFETs 641p-644p. NFET 641n and PFET 641p are configured as a first transmission gate (a.k.a. pass-gate.) NFET 642n and PFET 642p are configured as a second transmission gate. NFET 643n and PFET 643p are configured as a third transmission gate. NFET 644n and PFET 644p are configured as a fourth transmission gate. The gates of NFETs 641n-642n are connected to node ISO. The gates of PFETs 641p-642p are connected to node ISOb. The gates of NFETs 643n-644n are connected to node OC. The gates of PFETs 643p-644p are connected to node OCb.

The swing of the signals on ISO and OC (i.e., the gates of NFETs 641n-644n) may be less than the bitline voltage. Thus, in normal operation, the control circuitry coupled to offset compensation switch block 600 may comprise circuitry that does not supply the OC and ISO nodes with respective signals that reach VBL (e.g., the digital logic supply voltage.)

The signals on ISOb and OCb are the respective complement (i.e., logical inversion) of the signals on ISO and OC. The swing of the signals on ISOb and OCb (i.e., the gates of PFETs 641p-632p and PFETs 643p and 644p, respectively) may be equal to the bitline voltage. The swing of the signals on ISOb and OCb may be greater than to the bitline voltage minus the threshold voltage of the PFETs 641p-644p. Thus, in normal operation, the control circuitry coupled to offset compensation switch 600 may comprise circuitry that can supply the ISOb and OCb nodes with respective signals that at least reach VBL minus the threshold voltage of the PFETs 641p-644p.

The methods, systems and devices described above may be implemented in computer systems, or stored by computer systems. The methods described above may also be stored on a non-transitory computer readable medium. Devices, circuits, and systems described herein may be implemented using computer-aided design tools available in the art, and embodied by computer-readable files containing software descriptions of such circuits. This includes, but is not limited to one or more elements of DRAM device 100, sense amplifier 200, local-global switch 300, bitline to local data line switch 400, sense amplifier 500, and/or offset compensation switch block 600, and their components. These software descriptions may be: behavioral, register transfer, logic component, transistor, and layout geometry-level descriptions. Moreover, the software descriptions may be stored on storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, and so on.

Figure 7:
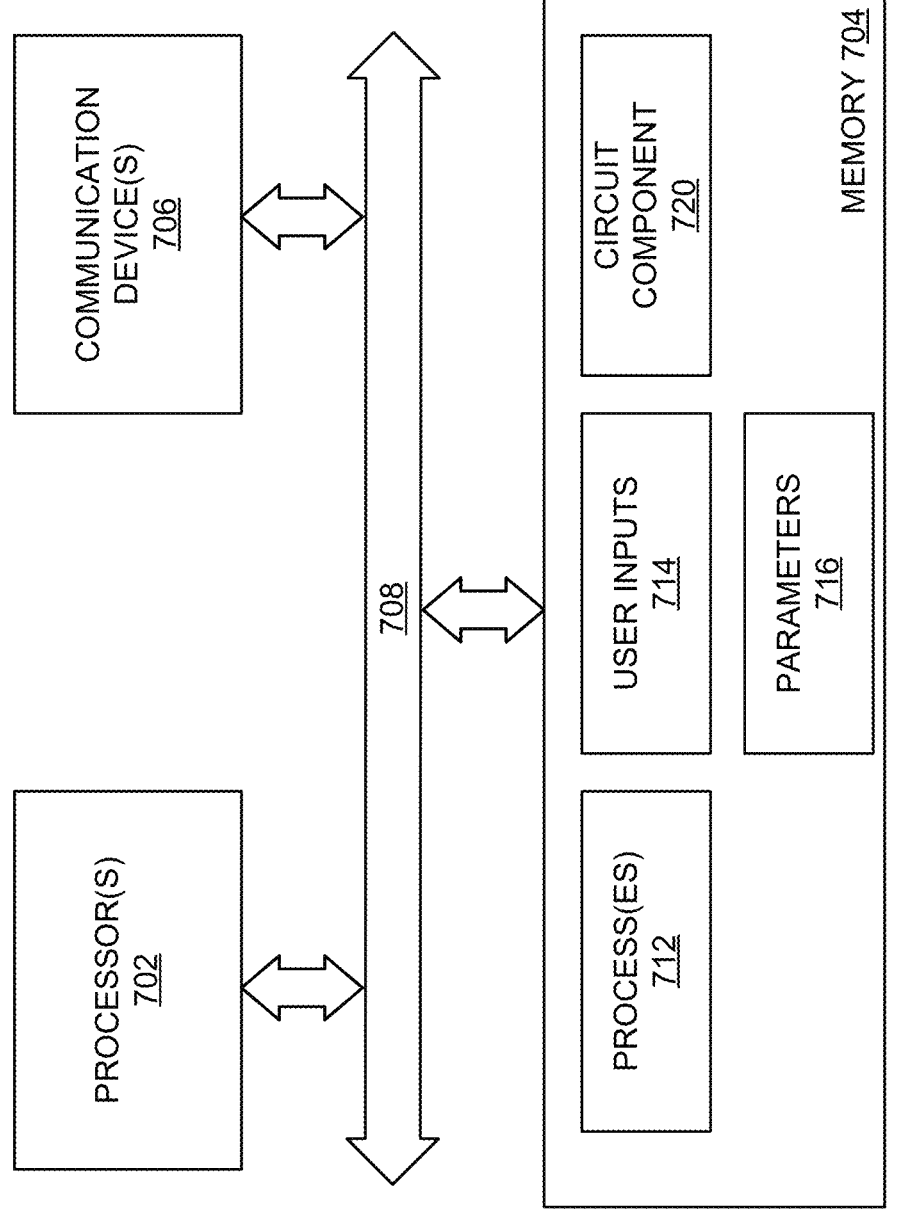
FIG. 7 is a block diagram of a processing system.

FIG. 7 is a block diagram illustrating one embodiment of a processing system 700 for including, processing, or generating, a representation of a circuit component 720. Processing system 700 includes one or more processors 702, a memory 704, and one or more communications devices 706. Processors 702, memory 704, and communications devices 706 communicate using any suitable type, number, and/or configuration of wired and/or wireless connections 708.

Processors 702 execute instructions of one or more processes 712 stored in a memory 704 to process and/or generate circuit component 720 responsive to user inputs 714 and parameters 716. Processes 712 may be any suitable electronic design automation (EDA) tool or portion thereof used to design, simulate, analyze, and/or verify electronic circuitry and/or generate photomasks for electronic circuitry. Representation 720 includes data that describes all or portions of DRAM device 100, sense amplifier 200, local-global switch 300, bitline to local data line switch 400, sense amplifier 500, and/or offset compensation switch block 600, and their components, as shown in the Figures.

Representation 720 may include one or more of behavioral, register transfer, logic component, transistor, and layout geometry-level descriptions. Moreover, representation 720 may be stored on storage media or communicated by carrier waves.

Data formats in which representation 720 may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email User inputs 714 may comprise input parameters from a keyboard, mouse, voice recognition interface, microphone and speakers, graphical display, touch screen, or other type of user interface device. This user interface may be distributed among multiple interface devices. Parameters 716 may include specifications and/or characteristics that are input to help define representation 720. For example, parameters 716 may include information that defines device types (e.g., NFET, PFET, etc.), topology (e.g., block diagrams, circuit descriptions, schematics, etc.), and/or device descriptions (e.g., device properties, device dimensions, power supply voltages, simulation temperatures, simulation models, etc.).

Memory 704 includes any suitable type, number, and/or configuration of non-transitory computer-readable storage media that stores processes 712, user inputs 714, parameters 716, and circuit component 720.

Communications devices 706 include any suitable type, number, and/or configuration of wired and/or wireless devices that transmit information from processing system 700 to another processing or storage system (not shown) and/or receive information from another processing or storage system (not shown). For example, communications devices 706 may transmit circuit component 720 to another system. Communications devices 706 may receive processes 712, user inputs 714, parameters 716, and/or circuit component 720 and cause processes 712, user inputs 714, parameters 716, and/or circuit component 720 to be stored in memory 704.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A memory device, comprising:
   a memory array comprising memory cells coupled to bitlines and sense amplifier circuits coupled to the bitlines;
   the bitlines to operate, in a normal operating mode that is a non-test-mode, using a first voltage;
   the sense amplifier circuits to, in the normal operating mode and in order to deactivate cross-coupled inverters of the sense amplifier circuits that evaluate voltages on the bitlines, receive a first field-effect transistor (FET) gate control signal with the first voltage and a second FET gate control signal with a second voltage, and also to, in the normal operating mode and in order to activate the cross-coupled inverters, receive the first FET gate control signal with the second voltage and the second FET gate control signal with a third voltage, the third voltage being less than the first voltage, the sense amplifier circuits to, in the normal operating mode, apply the first voltage to the bitlines; and digital logic circuitry to control the sense amplifier circuits and operate, in the normal operating mode, using the third voltage as its supply voltage.

2. The memory device of claim 1, wherein the cross-coupled inverters are in a bi-stable flip-flop configuration that is coupled to respective bitlines of the memory array, the cross-coupled inverters of the sense amplifier circuits each having a negative supply node and positive supply node.

3. The memory device of claim 2, wherein the first voltage is selectively coupled to the positive supply node of the cross-coupled inverters of the sense amplifier circuits.

4. The memory device of claim 3, wherein the first voltage is selectively coupled to the positive supply node of the cross-coupled inverters of the sense amplifier circuits using p-channel field effect transistors (PFETs) having PFET gate nodes to be controlled, in the normal operating mode, by the first FET gate control signal.

5. The memory device of claim 3, wherein a negative supply voltage is selectively coupled to the negative supply node of the cross-coupled inverters of the sense amplifier circuits using n-channel field effect transistors (NFETs) having NFET gate nodes to be controlled, in the normal operating mode, by the second FET gate control signal.

6. The memory device of claim 2, wherein the sense amplifier circuits include bitline equalization circuitry that is to be controlled, in the normal operating mode, by the digital logic circuitry.

7. The memory device of claim 1, wherein a majority of circuitry of the memory device implemented using complementary metal-oxide-semiconductor (CMOS) type logic is operated, in the normal operating mode, using the third voltage as its positive supply voltage.

8. The memory device of claim 7, wherein the CMOS type logic is implemented using a high-k metal gate process.

9. An integrated circuit, comprising:

a memory array comprising memory cells coupled with bitlines and sense amplifier circuits coupled with the bitlines;

the sense amplifier circuits to, in a normal operating mode and in order to deactivate cross-coupled inverters of the sense amplifier circuits that evaluate voltages on the bitlines, receive a first field effect transistor (FET) gate control signal with a first voltage and a second FET gate control signal with a second voltage, and to also, in the normal operating mode and in order to activate the cross-coupled inverters, receive the first FET gate control signal with the second voltage and the second FET gate control signal with a third voltage, the first voltage to be greater than the third voltage, the first voltage to be applied, by the sense amplifier circuits, to the bitlines; and digital logic circuitry to control the sense amplifier circuits and operate, in the normal operating mode, using the third voltage as its supply voltage.

10. The integrated circuit of claim 9, wherein the cross-coupled inverters are in a bi-stable flip-flop configuration that is coupled to respective bitlines of the memory array, the cross-coupled inverters of the sense amplifier circuits each having a negative supply node and positive supply node.

11. The integrated circuit of claim 10, wherein the first voltage is selectively coupled to the positive supply node of the cross-coupled inverters of the sense amplifier circuits.

12. The integrated circuit of claim 11, wherein the first voltage is selectively coupled to the positive supply node of the cross-coupled inverters of the sense amplifier circuits using p-channel field effect transistors (PFETs) having PFET gate nodes to be controlled, in the normal operating mode, by the first FET gate control signal.

13. The integrated circuit of claim 11, wherein a negative supply voltage is selectively coupled to the negative supply node of the cross-coupled inverters of the sense amplifier circuits using n-channel field effect transistors (NFETs) having NFET gate nodes to be controlled, in the normal operating mode, by the second FET gate control signal.

14. The integrated circuit of claim 10, wherein the sense amplifier circuits include bitline equalization circuitry that is to be controlled, in the normal operating mode, by the digital logic circuitry.

15. The integrated circuit of claim 9, wherein a majority of circuitry of the integrated circuit that is implemented using complementary metal-oxide-semiconductor (CMOS) type logic is operated, in the normal operating mode, using the third voltage as its supply voltage.

16. The integrated circuit of claim 15, wherein the CMOS type logic is implemented using a high-k metal gate process.

17. A memory device, comprising:

digital logic circuitry to, in a normal operating mode, at least process column addresses and row addresses to access data stored in a memory array and to control one or more elements of sense amplifier circuits that are part of the memory array;

the memory array comprising memory cells coupled with bitlines and coupled with the sense amplifier circuits;

the sense amplifier circuit to, in the normal operating mode and in order to deactivate cross-coupled inverters of the sense amplifier circuits that evaluate voltages on the bitlines, receive a first field effect transistor (FET) gate control signal having a first voltage and a second FET gate control signal having a second voltage, and also to, in the normal operating mode and in order to activate the cross-coupled inverters, receive the first FET gate control signal with the second voltage and the second FET gate control signal with a third voltage, the third voltage to be less than the first voltage, the sense amplifier circuits to apply the first voltage to the bitlines, and the digital logic circuitry to operate, in the normal operating mode that is a non-test mode, using the third voltage as the digital logic circuitry's supply voltage.

18. The memory device of claim 17, wherein the cross-coupled inverters have a first output and a second output, the first output and the second output coupled to corresponding bitlines of the memory array, the cross-coupled inverters configured, in the normal operating mode, to resolve to a state where one of the first output and the second output is at a negative supply voltage and an other of the first output and the second output is at the first voltage.

19. The memory device of claim 18, wherein the sense amplifier circuits include equalization circuitry to drive the first output and the second output to a fourth voltage that is less than the first voltage.

20. The memory device of claim 19, wherein the equalization circuitry is to, in the normal operating mode, be activated by a third FET gate control signal having the third voltage.

* * * * *